United States Patent [19]

Downey

[11] Patent Number: 4,829,200
[45] Date of Patent: May 9, 1989

[54] LOGIC CIRCUITS UTILIZING A COMPOSITE JUNCTION TRANSISTOR-MOSFET DEVICE

[75] Inventor: Joel F. Downey, Kokomo, Ind.

[73] Assignee: Delco Electronics Corporation, Kokomo, Ind.

[21] Appl. No.: 108,225

[22] Filed: Oct. 13, 1987

[51] Int. Cl.⁴ .................. H03K 19/02; G06G 7/01; H01L 27/02
[52] U.S. Cl. .................................... 307/446; 307/243; 307/529; 307/570; 357/43; 357/46
[58] Field of Search ............... 357/430, 46; 307/443, 307/446, 529, 570, 241, 243; 328/104, 154

[56] References Cited
FOREIGN PATENT DOCUMENTS

| 0068883 | 6/1982 | European Pat. Off. | 307/475 |
| 0132822 | 7/1984 | European Pat. Off. | 307/446 |
| 0041816 | 3/1985 | Japan | 307/475 |

Primary Examiner—John S. Heyman
Assistant Examiner—Margaret Rose Wambach
Attorney, Agent, or Firm—Robert J. Wallace

[57] ABSTRACT

A composite device includes a junction transistor and an MOS transistor in which the channel region of the MOS transistor corresponds to a portion of the base region of the junction transistor. Such a device has a variety of applications in NAND and NOR circuits and as an analog transmission gate useful in a multiplexer.

13 Claims, 3 Drawing Sheets

LOGIC CIRCUITS UTILIZING A COMPOSITE JUNCTION TRANSISTOR-MOSFET DEVICE

FIELD OF THE INVENTION

This invention relates to a composite device that combines the properties of a bipolar junction transistor and an insulated gate field effect transistor for use in logic circuits and to such logic circuits.

BACKGROUND OF THE INVENTION

It is known to integrate in separate surface areas of a common semiconductive chip both an insulated gate field effect transistor and a bipolar transistor. However, the need for separate surface areas for the two transistors limits the packing density possible.

It has also been proposed hitherto to use common or over surface areas of a semiconductive chip to form various composite devices, particularly for use in power applications, such as variants of silicon controlled rectifiers, but these devices are not particularly suited for use as components of a logic circuit, where small size, high density and fast switching speeds are particularly important.

SUMMARY OF THE INVENTION

The present invention is directed to providing a composite device, useful in a logic circuit, that permits high density and fast switching speed by using a common surface region both as the channel of an insulated gate field effect transistor (IGFET) and as the base of a bipolar junction transistor. In particular, in accordance with the invention, a semiconductive chip, typically silicon, includes a region, such as a well, of one conductivity type, within which is included a limited region, or smaller well, of the opposite conductivity type, within the latter of which are included spaced apart a first surface region of the opposite conductivity type and a second surface region of the one conductivity type. This second surface region forms within the smaller well a PN junction, suitable for use as an emitting junction of a bipolar transistor, and an electrode connection to this second surface region serves both as the emitter electrode of the bipolar transistor and as the source electrode of the IGFET. An electrode connection to the first surface region serves as the base electrode for the junction transistor and the substrate connection of the IGFET. An insulating layer is provided over a limited surface portion of the smaller well that extends between its second surface region and the first well to serve as the gate oxide, and the underlying limited surface portion is used as the channel of the IGFET under control of an overlying gate electrode. A heavily doped surface region of the larger well serves as the contact region for the drain electrode of the IGFET and the collector of the junction transistor.

Essentially when used in a logic circuit, the device includes a current path between the electrode connection to the second surface region of the smaller well and the electrode connection to the larger well that serves both as the source-to-drain path of an IGFET nand the emitter-to-collector path of a junction transistor. The gate electrode of the IGFET and the base electrode of the junction transistor are included in separate control circuit branches of the logic circuit and provide separate control of the path whereby it may be made conductive by appropriate potentials applied to either electrode. This characteristic adapts the device readily for use in logic circuits, such as two-input NAND or NOR circuits. Additionally, such device can also be used as an analog transmission gate for use in multiplexer circuits.

The invention will be better understood from the following detailed description taken in conjunction with the accompanying drawings.

DESCRIPTION OF THE INVENTION

Figure 1:
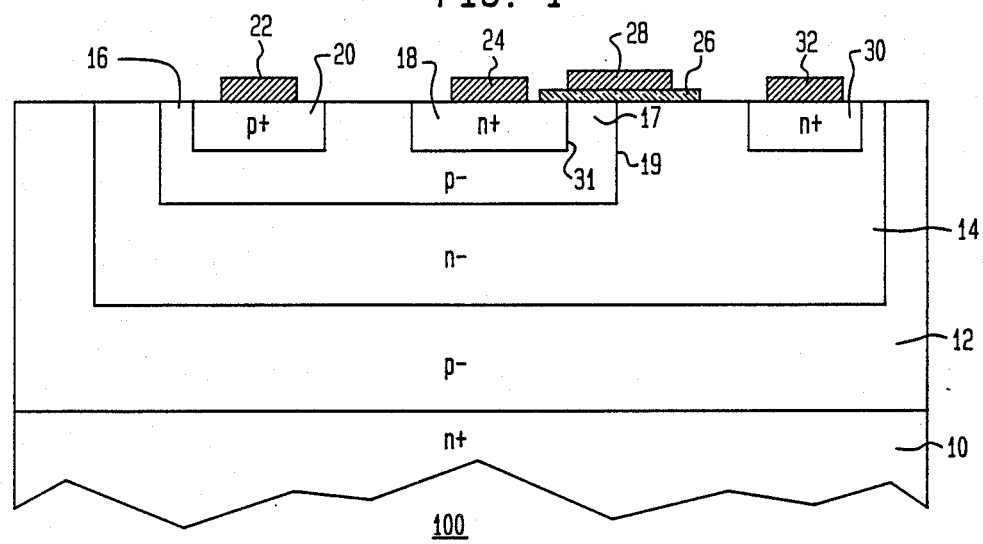
FIG. 1 shows an schematic cross section the structure of a composite device for use in logic circuits, in accordance with an illustrative embodiment of the present invention.

Referring now to FIG. 1, there is shown a composite device 100 for use in the invention as discussed. It is formed in a silicon chip that encompasses a bulk or substrate monocrystalline N+ type portion 10 over which has been grown a P-type epitaxial layer 12 in which are formed the various active components of an integrated circuit. There will be described only one composite device included within the epitaxial layer, although typically many will be incorporated spaced apart, along with other components of the integrated circuit. To this end, within the epitaxial layer there is formed a first relatively large N-type well 14 within which is included the N+ type surface zone 18 spaced from an edge of the well 16 by a portion 17 of length d, that is chosen to be appropriate both for the channel of the IGFET of the composite device and for the base of the junction transistor of the composite device. For efficient operation, the distance d needs to be less than the diffusion length of the electrons so that they can readily diffuse between the emitting and collecting junctions 31 and 19, respectively, of the junction transistor. Typically this distance will be about one or two microns and will largely determine the switching speed of the device. Also within the well 16 is formed the P+ type surface zone 20 that will serve as the contact area of an electrode 22 to provide a low resistance connection to the P-type well 16. An electrode 24 is also positioned over the surface region 18 to serve as a low resistance connection thereto. Overlying the region 17 is a grown silicon oxide layer 26 suitable for serving as the gate insulator of the IGFET component of the composite device. Over this layer 26 is the gate electrode 28. As is known, one edge of this electrode should essentially line up with the edge at the surface of the PN junction 18 formed between surface region 18 and the smaller well 16 while overlap of the edge at the surface of PN junction 19 is tolerable. Additionally, the larger well 14 is provided with an N+ type surface region 30 to serve as the contact area for electrode 32 to provide a low resistance connection to region 30.

The resulting structure first includes the N-channel IGFET formed by region 18 as the source, region 17 of the well 16 as the channel, and the regions 14 and 30 as the drain, and electrodes 24, 28 and 32 as the source, gate and drain electrodes, respectively. It also includes the NPN junction transistor of which region 18 serves as the emitter, region 17 as the base, and regions 14 and 30 as the collector. This type of transistor is typically denoted as a lateral junction transistor. Electrodes 24, 22 and 32 serve as the emitter, base, and collector electrodes, respectively.

Figure 2:
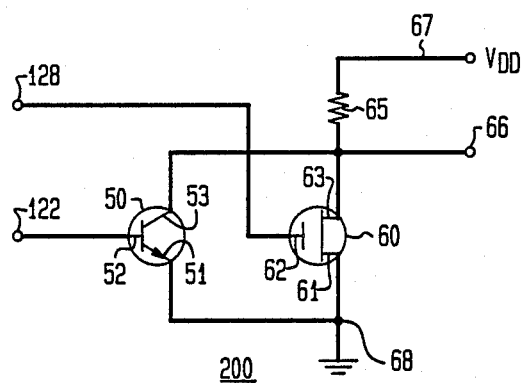
FIG. 2 shows a two-input NOR circuit in which the device of FIG. 1 may be used.

Referring now to FIG. 2, the composite device of FIG. 1 is shown, as separate NPN junction transistor 50 and N-channel IGFET 60, connected in a two-input NOR circuit 200. For the junction transistor 50, the emitter 51 corresponds to electrode 24, the base 52 to electrode 22, and the collector 53 to electrode 32. For the IGFET 60, the source 61 corresponds to electrode 24, the gate 62 corresponds to electrode 28, and the drain 63 to electrode 32. The input terminals 128 and 122 of the circuit 200, each available for the application of an input pulse, correspond to the gate electrode 28 and the base electrode 22, respectively. A load (illustrated as a resistor) 65 is connected between the common collector and drain, denoted as terminal 66, and a positive bus 67 Vdd of a voltage supply (not shown). The common emitter and source, denoted as node 68, is connected to a negative bus, shown as ground. Terminal 66 serves as an output terminal of circuit 200.

It can be appreciated that if either or both of inputs 128 or 122 of control circuit branches of the circuit is at a "one", or a positive potential above the threshold voltage transistor 60 or positive enough to forward bias the emitter-base junction of transistor 50, of either of the two transistors, there is conduction through the load 65, and the voltage at the output terminal 66, composite device is close to ground potential which is defined as a low or a "0". On the other hand, when inputs 128 and 122 are each at voltages such that transistors 50 and 60 are not biased on, the transistors do not conduct and the output terminal 66 remains essentially at Vdd which is defined as a high or a "1".

The circuit 200 shown in FIG. 2 can also be adapted for use as a gated amplifier or sampling circuit. In particular, if there be applied an analog signal by way of input 122 to the base 52 of the junction transistor, this signal will little affect the voltage at the output terminal 66 so long as the voltage on input 128 is high enough that IGFET 60 is already conducting in saturation. However, when the MOS transistor is non-conducting or at least not saturated, the signal applied at input 122 is reflected as an inverted amplified signal at the output terminal 66. Accordingly, if there be applied to input 128 a voltage which periodically cuts IGFET 60 off, at the intervals of cutoff, there become them available at output terminal 66, samples of the analog signal then being applied to the base electrode 52 of the junction transistor 50. These samples are inverted and amplified by the action of the junction transistor.

Figure 3:
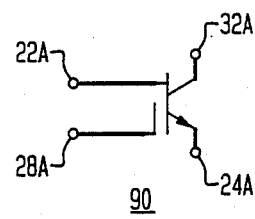
FIG. 3 shows a proposed symbol for use in a schematic of a circuit including the device of FIG. 1.

Referring now to FIG. 3, there is shown the symbol 90 for use in representing the composite device 100 of FIG. 1 in circuit schematics. The various terminals of symbol 90 are given the reference numerals used for the corresponding elements in FIG. 1 with the postscript A.

Figure 4:
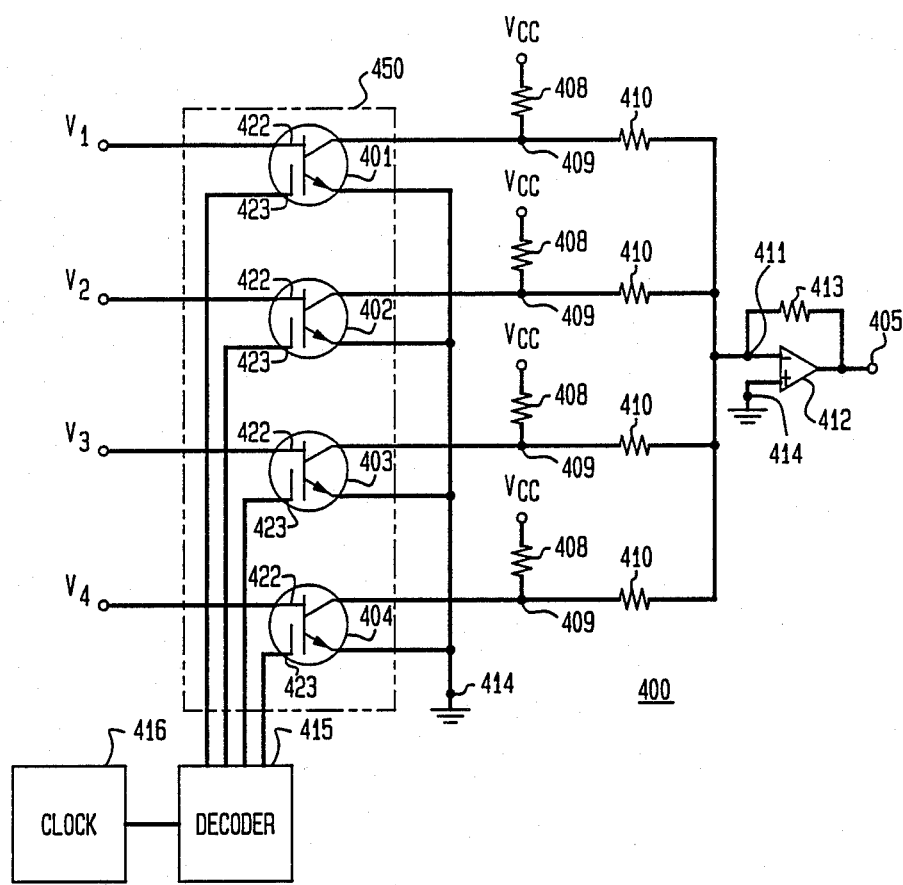
FIG. 4 is a circuit schematic of an analog multiplexer circuit including devices of the kind shown in FIG. 1 denoted by the symbol shown in FIG. 3.

Referring now to FIG. 4, there is shown an analog multiplexing circuit 400 that utilizes four composite devices 401, 402, 403, and 404, each shown by the symbol just discussed. Each of these devices is used as an analog transmission gate as previously discussed. To this end, each is operated to multiplex in turn samples of four analog signals V1, V2, V3 and V4, applied as first inputs to the four devices, into a common transmission path. The emitter-sources of each of the four composite devices is coupled to a terminal 414 which is shown coupled to a reference voltage which is ground. Typically the four composite devices will have been integrated in a common silicon chip in the usual integrated circuit fashion, as represented by their inclusion in broken line block 450. Each of the devices includes a separate load resistor 408 and a separate device output terminal 409. The various device output terminals are coupled by way of separate isolating resistors 410 to a common input terminal 411 of the operational amplifier 412, whose output terminal 405 supplies the common transmission path. The amplifier 412 serves as a buffer and has a resistor 413 coupled between one input terminal 411 and output terminal 405. A second input of amplifier 412 is coupled to a terminal 414 which is coupled to a reference potential illustrated as ground.

Each of the four analog signals, V1, V2, V3 and V4, to be multiplexed is supplied to a respective one of the bases 422 of the composite devices and each of the signals is sampled in turn by way of gating pulses supplied by the decoder 415 under control of the clock 416 to gates 423 of the composite devices. The decoder 41 supplies the gating pulses to the gates 423 of the composite devices. As discussed above, during the interval of such a pulse, the analog signal is sampled. This sample is applied to the operational amplifier for insertion in the common transmission path by way of the multiplexer output terminal 405 to which this path is connected.

It can be appreciated that by increasing the number of composite devices, the number of channels multiplexed is increased correspondingly.

The composite device can also be made in the complementary form comprising a PNP junction transistor and a P-channel MOS transistor simply by reversing the conductivity types of the various zones of the device shown in FIG. 1. In such complementary form, the composite device is particularly well suited for use as a two-input NAND device.

Figure 5:
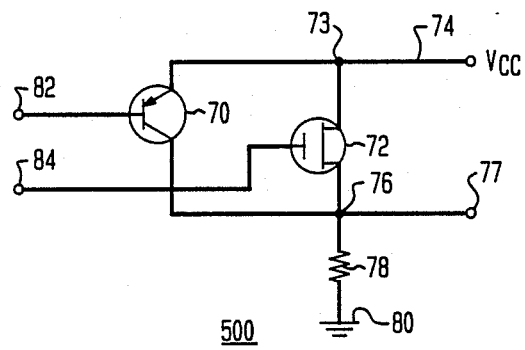
FIG. 5 shows a two-input NAND circuit in which the complement of the device of FIG. 1 may be used.

Referring now to FIG. 5, there is shown a two-input NAND circuit 500 in accordance with an embodiment of the present invention. Circuit 500 comprises a PNP transistor 70, a P-channel MOS transistor 72 and a resistor 78. Transistors 70 and 72 are part of a composite device which is essentially the same as device 100 of FIG. 1, except the polarities of the regions are reversed. As shown, a terminal 73 is coupled to the emitter of the junction transistor, to the source of the MOS transistor, and to a negative bus 74 of a voltage supply (not shown). A terminal 76, which is connected to the collector of the junction transistor and to the drain of the MOS transistor, serves an output terminal, and is also coupled by way of a load resistor 78 to the bus 80 of the voltage supply, shown as ground.

It can readily be appreciated when either of the input terminals 82 and 84 of control circuit branches of the composite device is driven by an applied pulse to a voltage that permits either or both of the junction transistor and the IGFET to conduct, the voltage at output terminal 77 approaches Vcc. However, when neither of the transistors is permitted to conduct, the voltage at the output terminal 77 remains essentially at ground.

The circuit 500 described can also be used as an analog transmission gate in a manner analogous to that described earlier for FIG. 2.

It should also be apparent that various changes should be made in the circuits described without departing from the spirit of the invention. In particular, it seems obvious that the various load resistors depicted may be replaced by active pulldown devices in the usual fashion to reduce power consumption. It should also be apparent that the particular characteristics of the composite devices described should make the devices useful in a variety of other circuit arrangements.

It should also be evident that various fabrication techniques are available for the ready fabrication of a composite device of the kind involved.

The embodiments of the invention in which an exclusive property or privilege is claimed are defined as follows:

1. A bipolar and insulated gate composite semiconductive integrated circuit logic device comprising;
   a semiconductive chip that includes along one surface first and second surface regions of one conductivity type spaced apart by a portion of a third region of the opposite conductivity type;
   first, second and third electrodes making low resistance connections to the first, second and third regions, respectively but not covering said spacing portion of said third region;
   a gate oxide layer overlying the surface of the spacing portion of the third region, which spacing portion extends between the first and second regions;
   a fourth electrode overlying the gate oxide layer and adapted for inverting the conductivity type of the surface of the spacing portion of the third region, which inverted surface would extend between the first and second regions and electrically short said first and second regions;
   a load circuit branch connected between the first and second electrodes including an output terminal;
   a first control circuit branch connected between one of the first and second electrodes and the third electrode and including a first input terminal for providing a bipolar transistor base current to said third electrode and a resulting low resistance electrical communication between said first and second regions through said third region;
   a second control circuit branch connected between said one of the first and second electrodes and the fourth electrode and including a second input terminal for providing a surface inverting voltage to said fourth electrode and a resulting low resistance electrical communication between said first and second regions through said inverted surface portion of said third region; and
   an output terminal in low resistance electrical communication with one of said first and second electrodes;
   effective to form a two input bipolar and insulated gate composite logic device.

2. The integrated circuit logic device of claim 1 wherein a separate output terminal is in low resistance electrical communication with each of the first and second electrodes of the two circuit branches.

3. The integrated circuit logic device of claim 1 wherein one electrode of said first and second electrodes is connected by low resistance to a point of reference potential.

4. The integrated circuit logic device of claim 3 wherein a load is connected between a power supply terminal and the other of said first and second electrodes.

5. The integrated circuit logic device of claim 1 wherein a second output terminal is connected to the other of said first and second electrodes but not necessarily by a low electrical resistance path.

6. The integrated circuit logic device of claim 1 wherein a load is connected between said one electrode and a point of reference potential.

7. The integrated circuit logic device of claim 4 included in a two-input NOR circuit in which said first and third regions are of N-type conductivity and said second region is of P-type conductivity.

8. The integrated circuit logic device of claim 6 included in a two-input NAND circuit in which said first and second regions are of P-type conductivity and said third region is of N-type conductivity.

9. The integrated circuit logic device of claim 1 included in a transmission gate with an information signal to be transmitted applied to said third electrode and a gating signal applied to said fourth electrode. pg,18

10. An analog multiplexer comprising:
    a plurality of semiconductive logic circuits each comprising:
    a semiconductive chip that includes along one surface first and second surface regions of one conductivity type spaced apart by a third region of the opposite conductivity type;
    first, second and third electrodes making low resistance connections to the first, second and third regions, respectively;
    a gate oxide layer overlying the surface of the portion of the third region extending between the first and second regions;
    a fourth electrode overlying the gate oxide layer and adapted for inverting the conductivity type of the surface of the portion of the third region extending between the first and second regions;
    a load circuit branch connected between the first and second electrodes including an output terminal;
    a first control circuit branch connected between one of the first and second electrodes and the third electrode and including a first input terminal;
    a second control circuit branch connected between said one of the first and second electrodes and the fourth electrode and including a second input terminal; and
    means for applying a plurality of analog information signals for sampling to the third electrodes of the respective ones of the plurality of logic circuits;
    means for applying a gating signal in turn to the fourth electrodes of respective ones of the logic circuits; and
    means for combining the outputs of the plurality of logic circuits in a common transmission path.

11. A logic circuit including a composite device combining an insulated gate field effect transistor and a bipolar transistors comprising:
    a silicon chip having along one surface a layer in which are included:
    a first well region of one conductivity type that includes a first surface portion of relatively high conductivity;
    a second well region of the opposite conductivity type whose bulk is of relatively low conductivity and that includes a second surface portion of relatively high conductivity, said second well region being enclosed within said first well region;
    a surface portion of the one conductivity type and of relatively high conductivity enclosed within the second well region and positioned to define a fourth surface portion of the second well region adaptable for use as the channel of the insulated gate field effect transistor and the base of the junction transistor; and a gate oxide layer overlying said fourth surface portion;

a first gate electrode overlying both said gate oxide layer and said fourth surface portion;

a second base electrode for making low resistance connection to said second surface portion;

a third electrode for making a low resistance connection to the first surface portion; and a fourth electrode for making a low resistance connection to said third surface portion;

the first gate electrode and the second base electrode being adapted for use as separate input terminals of the logic circuit; and one of the third and fourth electrodes being adapted for use as the output terminal of the logic circuit.

12. The logic circuit of claim 11 being a NAND logic circuit.

13. The logic circuit of claim 11 being a NOR logic circuit.

* * * * *